US006187643B1

(12) United States Patent
Borland

(10) Patent No.: US 6,187,643 B1
(45) Date of Patent: Feb. 13, 2001

(54) SIMPLIFIED SEMICONDUCTOR DEVICE MANUFACTURING USING LOW ENERGY HIGH TILT ANGLE AND HIGH ENERGY POST-GATE ION IMPLANTATION (POGI)

(75) Inventor: John O. Borland, S. Hamilton, MA (US)

(73) Assignee: Varian Semiconductor Equipment Associates, Inc., Gloucester, MA (US)

(*) Notice: Under 35 U.S.C. 154(b), the term of this patent shall be extended for 0 days.

(21) Appl. No.: 09/342,958

(22) Filed: Jun. 29, 1999

(51) Int. Cl.[7] .................................................. H01L 21/336
(52) U.S. Cl. ........................... 438/302; 438/303; 438/515
(58) Field of Search ..................... 438/302–305, 438/228, 515–519, 525, 527

(56) References Cited

U.S. PATENT DOCUMENTS

| 5,501,993 | 3/1996 | Borland . | |
|---|---|---|---|
| 5,571,745 | 11/1996 | Horiuchi . | |
| 5,814,866 | * 9/1998 | Borland | 438/228 |
| 5,821,589 | 10/1998 | Borland | 257/369 |
| 5,827,747 | * 10/1998 | Wang et al . | 438/303 |
| 5,913,124 | * 6/1999 | Lin et al. | 438/305 |
| 5,949,112 | 9/1999 | Gossmann et al. | 257/369 |
| 6,008,099 | * 12/1999 | Sultan et al. | 438/302 |
| 6,020,231 | * 2/2000 | Wang et al. | 438/228 |
| 6,054,342 | 4/2000 | Gossmann et al. | 438/199 |

OTHER PUBLICATIONS

H. Mikoshiba et al., "A Novel CMOS Process Utilizing After–Gate–Implant. Process", IEEE, 1986 Sym. VLSI Tech., Jun. 1986, pp. 41–42.

Y.V. Ponomarev et al, "Channel Profile Eng. of 0.1um–Si MOSFETs by Through –th–gate Imp.", IEEE, IEDM–98, Dec. 1998, pp. 635–638.

H. Yoshimura et al, "New CMOS Shallow Junc. Well FET Structure (CMOS–SJET) for Low Power Supply Voltage", IEEE, IEDM–92, Dec. 1995, pp. 35.8.1–35.8.4.

S. Onishi et al, "A New Meth. For Eval. Temp. Distribution by Using $Si^+ + B^+$ Impantation", SPiE vol. 1189 Rapid Isothermal Processing (1989), pp. 83–87.

C. Osburn et al, "Ultra–Shallow Junc.Formation using Very Low Energy B and $BF_2$ Sources", 11th Int'l. Cong. On Ion Implant Tech., Jun. 1996, 6 pages.

J.O. Borland et al, "Using Dopant Activation of Implanted Wafers for Low Temp. (400° C.–600 ° C.) Meas. In CVD Equip. Design", Implant Tech. Conf., Jun. 1993, 3 pages.

* cited by examiner

Primary Examiner—David Nelms
Assistant Examiner—Dung A Le
(74) Attorney, Agent, or Firm—Wolf, Greenfield & Sacks, P.C.

(57) ABSTRACT

Methods are provided for fabrication of a circuit on a substrate. After formation of gate electrodes, sidewall spacers are formed on the sides of the gate electrodes. Source/drain extensions and source/drain regions of p-type devices are implanted through openings in a first mask. Source/drain extensions and source/drain regions of n-type devices are implanted through openings in a second mask. The source/drain extensions are implanted at low energy and at a high tilt angle with respect to a normal to the substrate surface, so that the source/drain extensions are formed laterally under the sidewall spacers. The source/drain regions are implanted at low or zero tilt angle and at equal to or higher energy and higher dose than the steps of implanting the source/drain extensions. In one optional feature, the first and second masks are used for implanting wells, channel stops and threshold adjusts for the p-type devices and the n-type devices, respectively. In another optional feature, a third mask is used to perform a buried implanted layer for lateral isolation (BILLI) process.

16 Claims, 13 Drawing Sheets

SIMPLIFIED SEMICONDUCTOR DEVICE MANUFACTURING USING LOW ENERGY HIGH TILT ANGLE AND HIGH ENERGY POST-GATE ION IMPLANTATION (PoGI)

FIELD OF THE INVENTION

This invention relates to semiconductor device manufacturing and, more particularly, to the use of low energy, high tilt angle and high energy post-gate ion implantation (PoGI) to simplify semiconductor device manufacturing.

BACKGROUND OF THE INVENTION

Complementary metal oxide semiconductor (CMOS) technology has come into standard use in semiconductor device manufacturing. CMOS circuits include combinations of p-type MOS devices and n-type MOS devices, and are characterized by low power consumption and high packaging density. A significant trend in semiconductor device manufacturing is toward reduced device dimensions, resulting in increased packaging density and increased circuit complexity. As device dimensions are reduced, processes become more complex. Notwithstanding the increased complexity, processing costs must be carefully controlled.

A current front end of line (FEOL) CMOS process typically involves the use of eight patterned masks, six of which are implant masks. First and second implant masks are used to dope the substrate surface by n-type and p-type ion implantation prior to formation of gate electrodes. These doped regions are called n-wells and and p-wells, and can contain multiple dopant profiles, such as wells, channel stops, punch through stops and threshold adjusts. After formation of gate electrodes, a third implant mask is used for a p+ source/drain extension implant and an optional halo implant, and a fourth implant mask is used for an n+ source/drain extension implant and an optional halo implant. After deposition and etching of a sidewall insulator layer to form sidewall spacers on the sides of the gate electrodes, a fifth implant mask is used for a p+ source/drain implant, and a sixth implant mask is used for an n+ source/drain implant. It is estimated that each mask adds approximately 30 dollars to the cost of an eight inch semiconductor wafer. In addition, multiple implant masks increase processing time and increase the risk of processing error.

A CMOS process utilizing post gate implantation of wells, channels and source/drains is disclosed by H. Mikoshiba et al in "A Novel CMOS Process Utilizing After-Gate-Implantation Process", IEEE, 1986 Symposium on VLSI Technology, June 1986, pages 41–42.

A technique for forming super-steep retrograde channel profiles using ion implantation through the gate is disclosed by Y. V. Ponomarev et al in "Channel Profile Engineering of 0.1 $\mu$m-Si MOSFET's by Through-the-Gate Implantation", IEEE, IEDM-98, Dec. 1998, pages 635–638.

A shallow junction well FET structure, wherein ion implantations for a shallow p-well and n-well were performed through the gate electrodes, is disclosed by H. Yoshimura et al in "New CMOS Shallow Junction Well FET Structure (CMOS-SJET) For Low Power-Supply Voltage", IEEE, IEDM-92, Dec. 1992, pages 35.8.1–35.8.4.

A CMOS fabrication process wherein CMOS vertically modulated wells are constructed by using clustered MeV ion implantation to form a structure having a buried implanted layer for lateral isolation is disclosed in U.S. Pat. No. 5,501,993 issued Mar. 26, 1996 to Borland; U.S. Pat. No. 5,814,866 issued Sep. 29, 1998 to Borland; and U.S. Pat. No. 5,821,589 issued Oct. 13, 1998 to Borland.

All of the known prior art semiconductor fabrication processes have one or more disadvantages, including a high degree of complexity and high cost. Accordingly, there is a need for simplified semiconductor fabrication processes which are capable of producing high density devices at low cost.

SUMMARY OF THE INVENTION

According to a first aspect of the invention, a method is provided for use in the fabrication of a circuit on a substrate. After formation of gate electrodes, a sidewall insulator layer is deposited on the substrate, and the sidewall insulator layer is etched to form sidewall spacers on the sides of the gate electrodes. Source/drain extensions and source/drain regions of p-type devices are implanted through openings in a first mask. Source/drain extensions and source/drain regions of n-type devices are implanted through openings in a second mask. The steps of implanting source/drain extensions are performed at low energy and at a high tilt angle with respect to a normal to the substrate surface, so that the source/drain extensions are formed laterally under the sidewall spacers. The source/drain extensions optionally may be formed under portions of the gate electrodes. The steps of implanting the source/drain regions are performed at low or zero tilt angle with respect to a normal to the substrate surface and at equal to or higher energy and higher dose than the steps of implanting the source/drain extensions.

An optional halo or pocket implant through the openings in the first mask may be used to form n-type pocket implants in the p-type devices. An optional halo or pocket implant through the openings in the second mask may be used to form p-type pocket implants in the n-type devices.

According to a feature of the invention, the method may further comprise implanting an n-well, a channel stop, and a threshold adjust for the p-type devices through the openings in the first mask. An optional punchthrough stop for the p-type devices may be implanted through the openings in the first mask. The steps of implanting the n-well, the channel stop and the threshold adjust for the p-type devices are performed at sufficient energy to pass through the gate electrodes and at low or zero tilt angle with respect to the normal to the substrate surface. The method may further comprise implanting a p-well, a channel stop, and a threshold adjust for the n-type devices through the openings in the second mask. An optional punchthrough stop for the n-type devices may be implanted through the openings in the second mask. The steps of implanting the p-well, the channel stop and the threshold adjust layer for the n-type devices are performed at sufficient energy to pass through the gate electrodes and at low or zero tilt angle with respect to the normal to the substrate surface.

According to another feature of the invention, the method may further comprise the step of implanting a material, such as silicon or germanium, to form a pre-amorphorization layer prior to the steps of implanting source/drain extensions and implanting source/drain regions. Implantation of the pre-amorphorization layer facilitates a subsequent low temperature solid phase epitaxial regrowth step for low temperature dopant activation with minimal thermal diffusion.

According to a further feature of the invention, a p-well, a channel stop, and a threshold adjust for the n-type devices are implanted through non-open areas of a third mask prior to the step of forming the gate electrodes, and an n-well, a channel stop, and a threshold adjust for the p-type devices are implanted through openings in the third mask prior to the step of forming the gate electrodes.

According to another aspect of the invention, a method is provided for use in the fabrication of a device on a substrate. After formation of a gate electrode of the device, a sidewall insulator layer is deposited, and the sidewall insulator layer is etched to form sidewall spacers on the sides of the gate electrode. Source/drain extensions of the device are implanted through openings in a mask. The step of implanting source/drain extensions is performed at low energy and at a high tilt angle with respect to a normal to the substrate surface, wherein the source/drain extensions are formed laterally under the sidewall spacers. Source/drain regions of the device are implanted through the openings in the same mask. The step of implanting source/drain regions is performed at low or zero tilt angle with respect to the normal to the substrate surface and at equal to or higher energy and higher dose than the step of implanting source/drain extensions.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
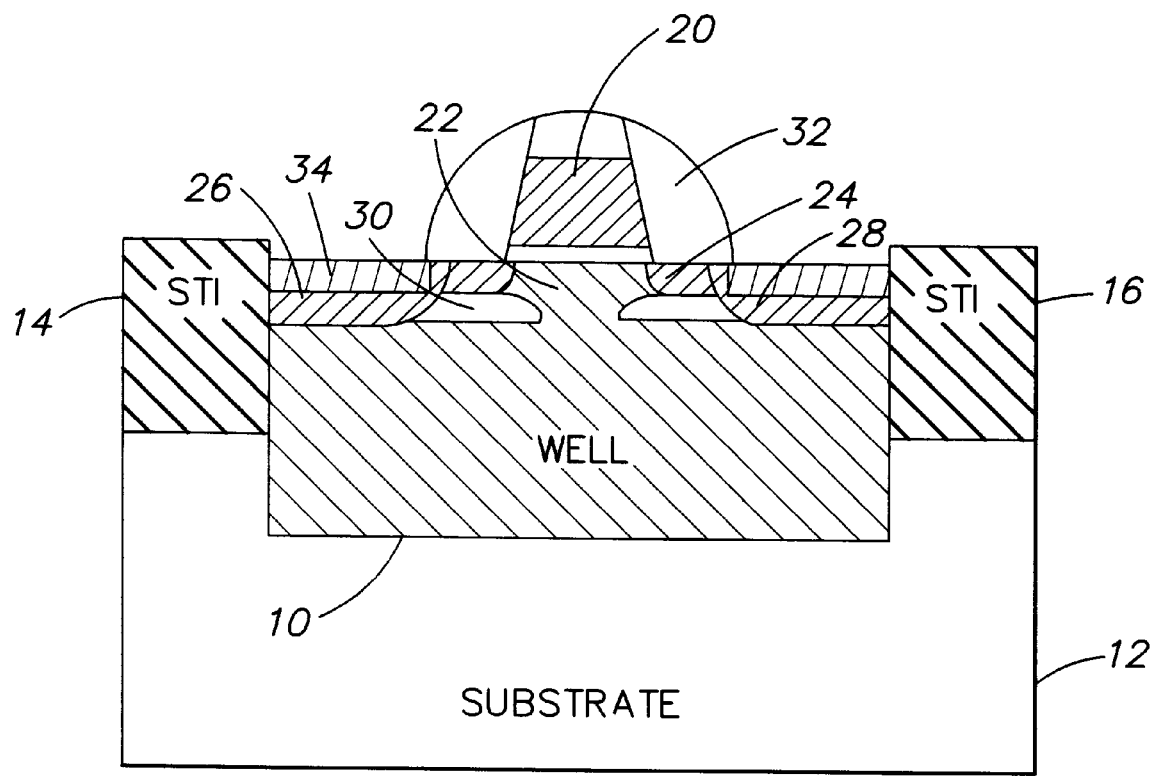
FIG. 1 is a cross-sectional diagram of a typical MOS device used in CMOS circuitry.

A cross-sectional view of an MOS device used in CMOS circuits is shown in FIG. 1. A well 10 (p-well or n-well) is formed in a silicon substrate 12 between isolation regions 14 and 16. A gate electrode 20 is formed over a channel 22. Relatively shallow source/drain extensions 24 extend from opposite ends of channel 22 to relatively deep source and drain regions 26 and 28, respectively. A halo or pocket implant 30 may be located below source/drain extensions 24. A sidewall spacer 32 on the sides of gate electrode 20 facilitates implantation of source/drain extensions 24, source 26 and drain 28, as described below. Silicide contacts 34 are formed in gate electrode 20, source 26 and drain 28. A typical CMOS integrated circuit formed on substrate 12 includes multiple n-type MOS devices and multiple p-type MOS devices in a CMOS configuration, as known in the art.

Figure 2A:
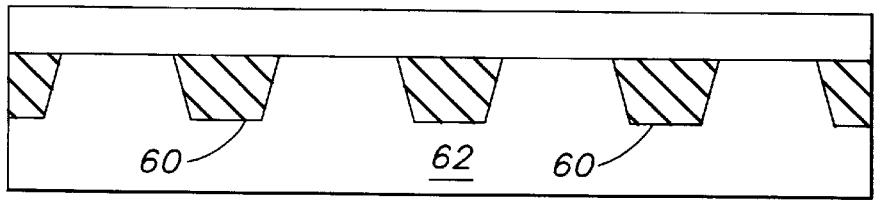
FIGS. 2A–2J illustrate a prior art process for fabrication of CMOS circuitry.
Figure 2B:
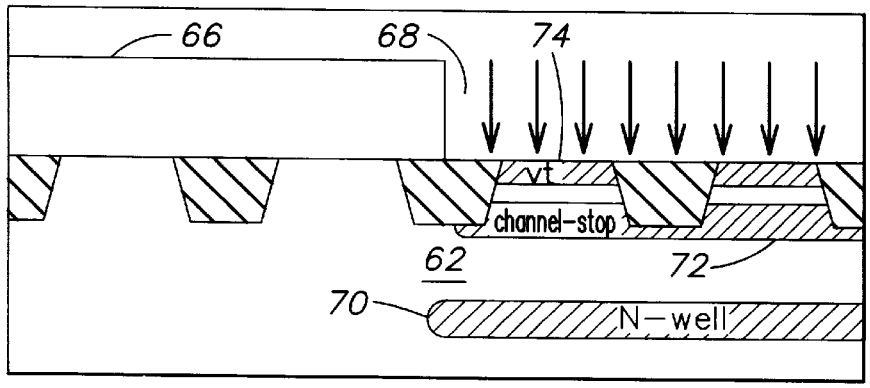

A prior art process for fabrication of CMOS circuits is illustrated in FIGS. 2A–2J. As shown in FIG. 2A, isolation regions 60 are formed in a substrate 62 by local oxidation of silicon (LOCOS) through openings in a first mask (not shown) or by shallow trench isolation (STI) structures etched and filled in the substrate using the first mask. As shown in FIG. 2B, a second mask 66 having openings 68 is disposed on the surface of substrate 62. Second mask 66 exposes regions where p-type devices are being fabricated and blocks regions where n-type devices are being fabricated. An n-well 70, a channel stop 72 and a $V_{tp}$ threshold adjust 74 of the p-type devices are implanted through openings 68 in second mask 66. An optional punchthrough stop may be implanted through openings 68 in second mask 66.

Figure 2C:
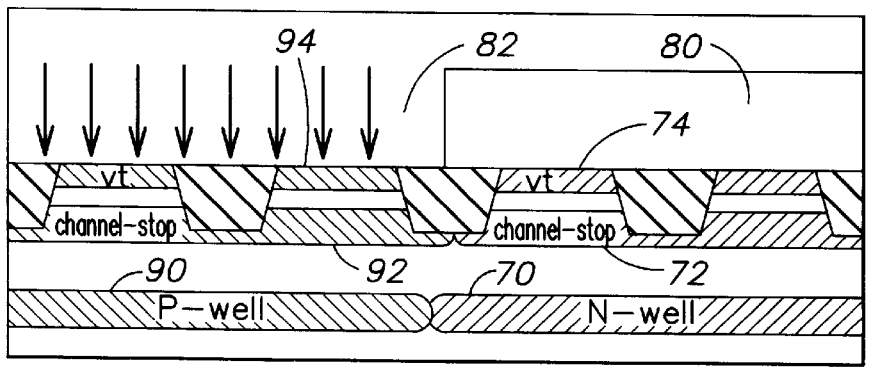

As shown in FIG. 2C, second mask 66 is removed from the substrate and a third mask 80 having openings 82 is disposed on the surface of substrate 62. Third mask 80 exposes areas where n-type devices are being fabricated and blocks areas where p-type devices are being fabricated. A p-well 90, a channel stop 92 and a $V_{tn}$ threshold adjust 94 of the n-type devices are implanted through openings 82 in third mask 80. An optional punchthrough stop may be implanted through openings 82 in third mask 80.

Figure 2D:
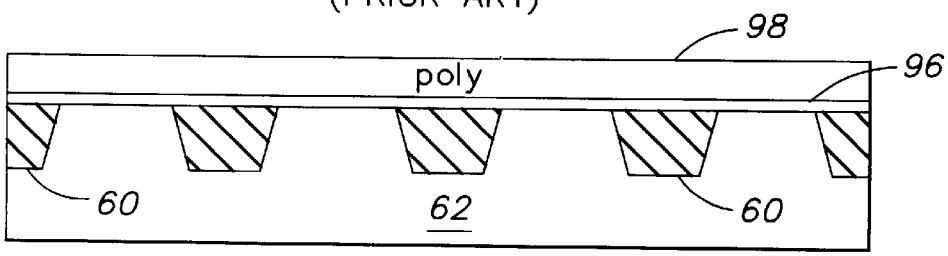
Figure 2E:
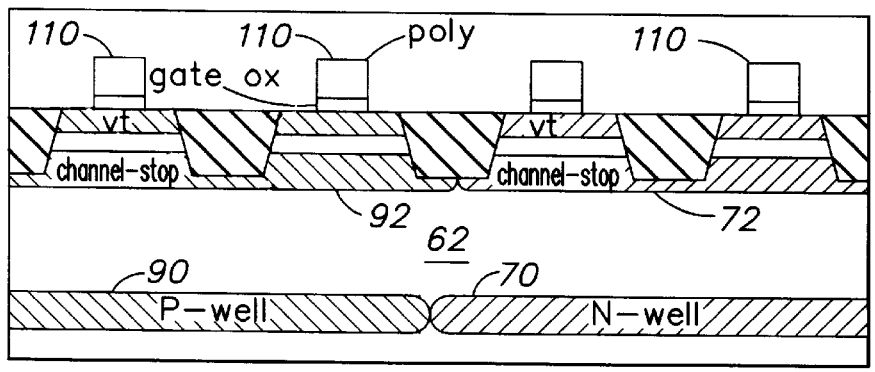

As shown in FIG. 2D, third mask 80 is removed, and a gate oxide layer 96 and a polysilicon layer 98 are deposited on substrate 62. As shown in FIG. 2E, gate oxide layer 96 and polysilicon layer 98 are etched using a fourth mask (not shown) to define gate electrodes 110.

Figure 2F:
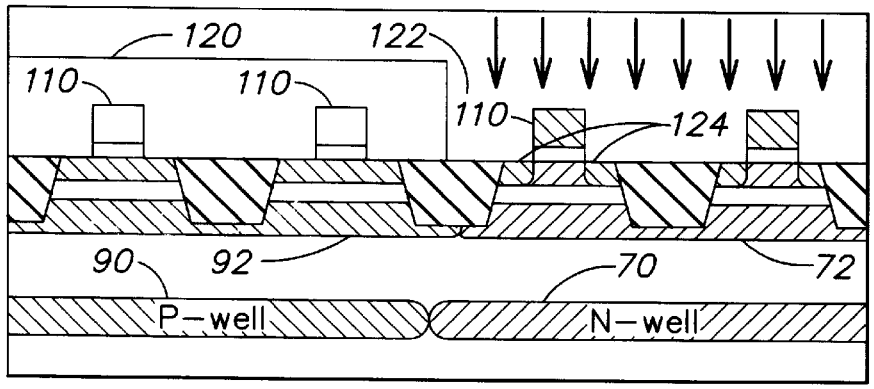

As shown in FIG. 2F, a fifth mask 120 having openings 122 is disposed on the surface of substrate 62. Fifth mask 120 exposes regions where p-type devices are being fabricated and blocks regions where n-type devices are being fabricated. A shallow p+ implant through openings 122 in fifth mask 120 forms source/drain extensions 124 of the p-type devices. At this time, an optional halo or pocket implant through openings 122 in fifth mask 120 may be used to form n-type pocket implants in the p-type devices.

Figure 2G:
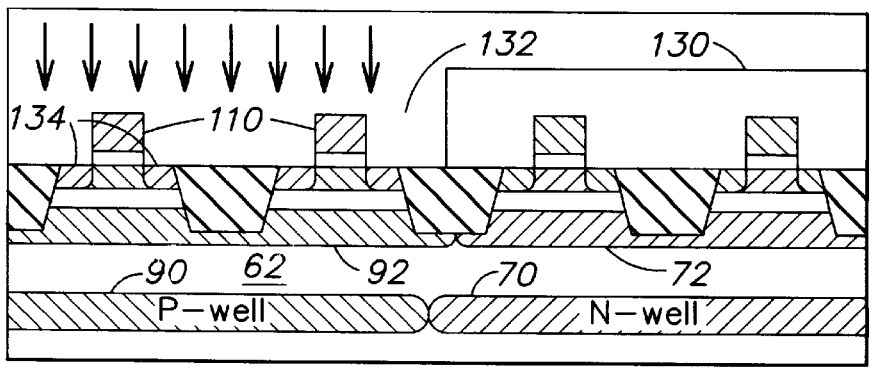

As shown in FIG. 2G, fifth mask 120 is removed from substrate 62 and a sixth mask 130 having openings 132 is disposed on the surface of substrate 62. Sixth mask 130 exposes regions where n-type devices are being fabricated and blocks regions where p-type devices are being fabricated. A shallow n+ implant through openings 132 in sixth mask 130 forms source/drain extensions 134 of the n-type devices. At this time, an optional halo or pocket implant through openings 132 in sixth mask 130 may be used to form p-type pocket implants in the n-type devices.

Figure 2H:
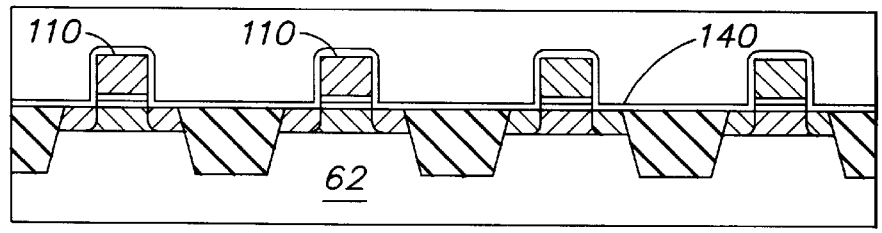
Figure 2I:
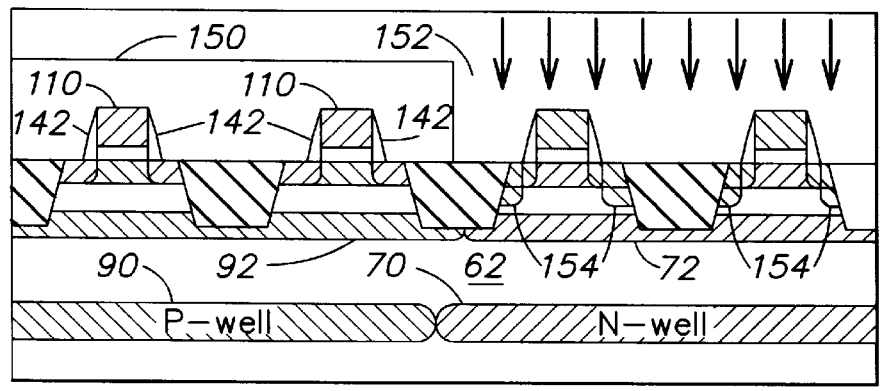

As shown in FIG. 2H, sixth mask 130 is removed from substrate 62, and a sidewall insulator layer 140 is deposited on substrate 62 so as to cover the vertical or nearly vertical sides of gate electrodes 110. The insulator layer 140 may be oxide, nitride, polysilicon or a combination thereof, such as an oxide-nitride sandwich or an oxide-polysilicon sandwich. The insulator layer 140 typically has a thickness in a range of 100 to 1000 angstroms. As shown in FIG. 2I, sidewall insulator layer 140 is etched, using a directional etch process, to produce sidewall spacers 142 on the sidewalls of gate electrodes 110.

Figure 2J:
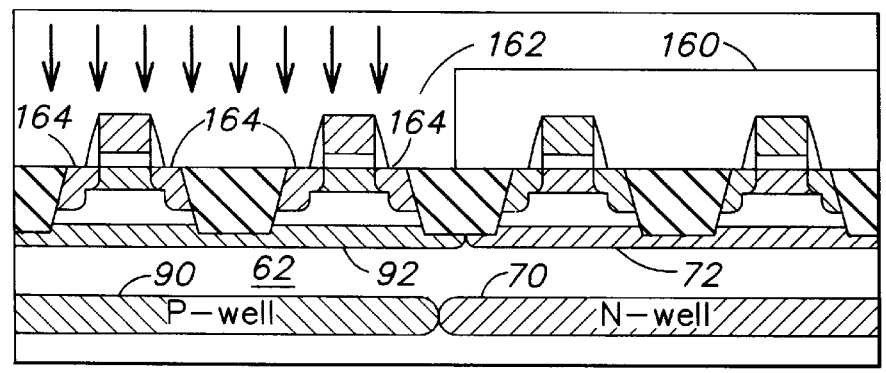

As further shown in FIG. 2I, a seventh mask 150 having openings 152 is disposed on the surface of substrate 62. Seventh mask 150 exposes regions where p-type devices are being fabricated and blocks regions where n-type devices are being fabricated. A p+ source/drain implant through openings 152 in seventh mask 150 forms source/drain regions 154 of the p-type devices. The p+ source/drain implant is typically at higher energy and higher dose than the p+ source/drain extension implant, so that the source/drain regions 154 are deeper than the source/drain extensions 124. As shown in FIG. 2J, seventh mask 150 is removed, and an eighth mask 160 having openings 162 is disposed on the surface of substrate 62. Eighth mask 160 exposes areas where n-type devices are being fabricated and blocks areas where p-type device are being fabricated. An n+ source/drain implant through openings 162 in eighth mask 160 forms source/drain regions 164 of the n-type devices.

It may be observed that the prior art process shown in FIGS. 2A–2J and described above utilizes a total of eight masks, six of which are implant masks. Accordingly, the prior art process is relatively complex and expensive.

Figure 3A:
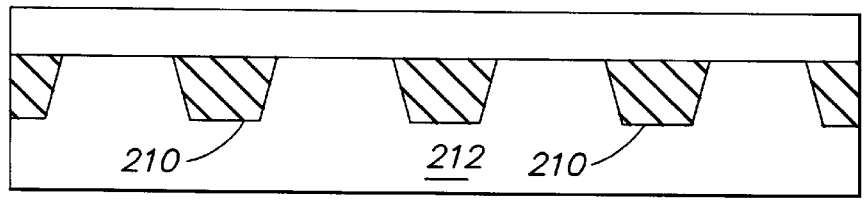
FIGS. 3A–3H illustrate a process for fabrication of CMOS circuitry in accordance with a first embodiment of the invention.

A simplified process for fabricating CMOS integrated circuits in accordance with a first embodiment of the invention is shown in FIGS. 3A–3H. As shown in FIG. 3A, a first mask (not shown) is used to form isolation regions 210 in a substrate 212 by LOCOS or STI as described above in connection with FIG. 2A. Isolation regions 210 are spaced apart to define regions for fabrication of p-type devices and n-type devices in substrate 212.

Figure 3B:
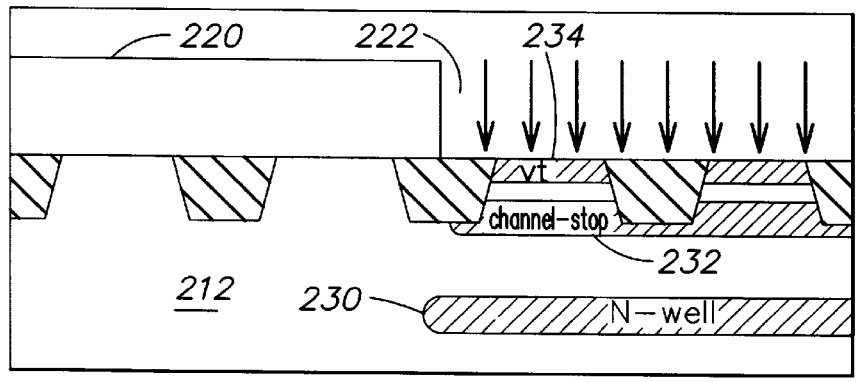

As shown in FIG. 3B, a second mask 220 having openings 222 is disposed on the surface of substrate 212. Second mask 220 exposes areas where p-type devices are being fabricated and blocks areas where n-type devices are being fabricated. An n-well 230, a channel stop 232 and a $V_{tp}$ threshold adjust 234 of the p-type devices are implanted through openings 222 in second mask 220. It will be understood that the n-well, the channel stop and the threshold adjust may each have different implant parameters as described below. An optional punchthrough stop of the p-type devices may be implanted through openings 222 in second mask 220.

Figure 3C:
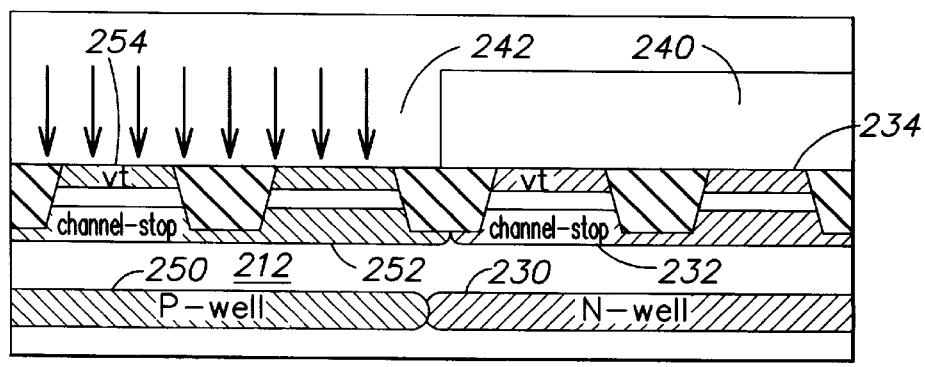

As shown in FIG. 3C, second mask 220 is removed from substrate 212, and a third mask 240 having openings 242 is disposed on the surface of substrate 212. Third mask 240 exposes areas where n-type devices are being fabricated and blocks areas where p-type devices are being fabricated. A p-well 250, a channel stop 252 and a $V_{tn}$ threshold adjust 254 of the n-type devices are implanted through openings 242 in third mask 240. The p-well 250, the channel stop 252 and the threshold adjust 254 may each have different implant parameters as described below. An optional punchthrough stop of the n-type devices may be implanted through openings 242 in third mask 240.

Figure 3D:
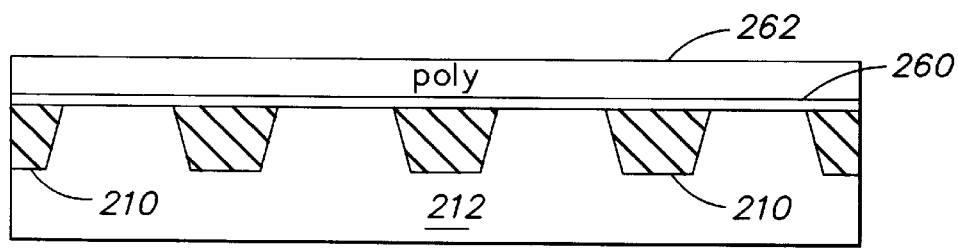
Figure 3E:
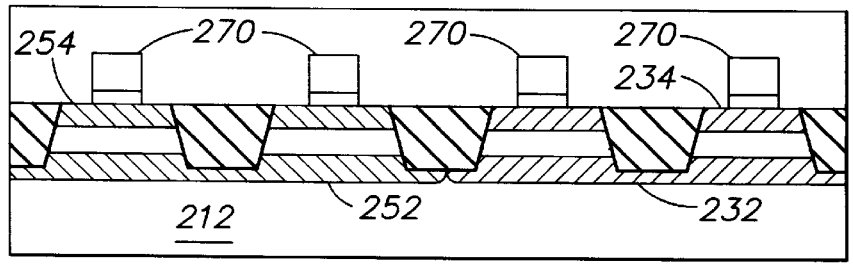
Figure 3F:
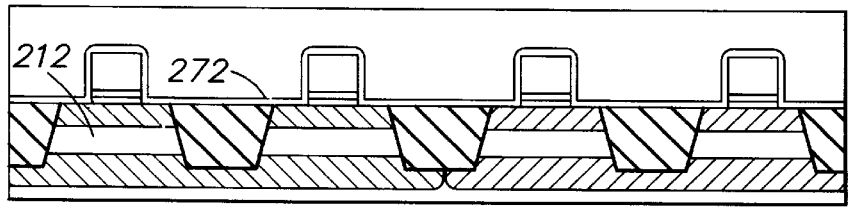
Figure 3G:
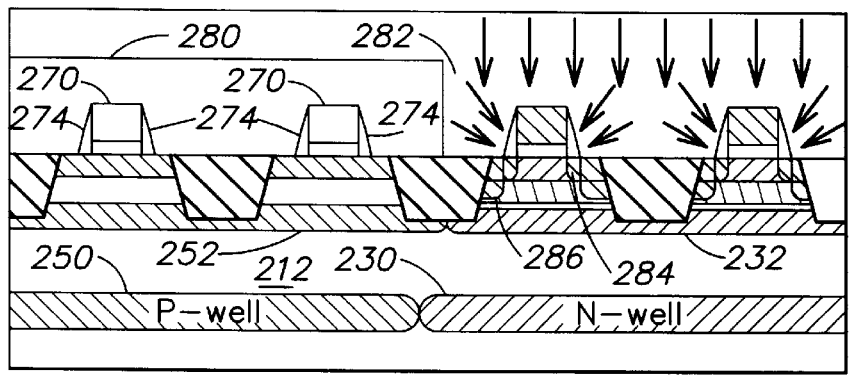

As shown in FIG. 3D, third mask 240 is removed, and a gate oxide layer 260 and a polysilicon layer 262 are deposited on substrate 212. As shown in FIG. 3E, a fourth mask (not shown) is used to etch the gate oxide layer 260 and the polysilicon layer 262 to form gate electrodes 270. As shown in FIG. 3F, a sidewall insulator layer 272 is deposited on substrate 212. The sidewall insulator layer 272 may be fabricated as described above in connection with FIG. 2H. As shown in FIG. 3G, sidewall insulator layer 272 is etched, using a directional etch process, to produce sidewall spacers 274 on the vertical or nearly vertical sides of gate electrodes 270.

Then, an optional pre-amorphization implant may be performed. Silicon or germanium is implanted to form a pre-amorphization layer which may facilitate a subsequent low temperature solid phase epitaxial regrowth process for low temperature dopant activation with minimal thermal diffusion for shallow junction formation. The pre-amorphization implant may be used to facilitate low temperature solid phase epitaxial regrowth of shallow junction source/drain extensions and source/drain regions with a thermal anneal treatment at 500° C. to 800° C. The thermal treatment time depends on the equipment used and may range from 30 seconds to one minute in a rapid thermal processor to 20 to 30 minutes in a batch furnace. In another application, the pre-amorphization implant may be used as a surface preparation to facilitate facet free elevated source/drain structures by selective silicon (single crystal, polysilicon or amorphous) deposition.

A fifth mask 280 having openings 282 is disposed on the surface of substrate 212. Fifth mask 280 exposes areas where p-type devices are being fabricated and blocks areas where n-type devices are being fabricated.

Figure 4:
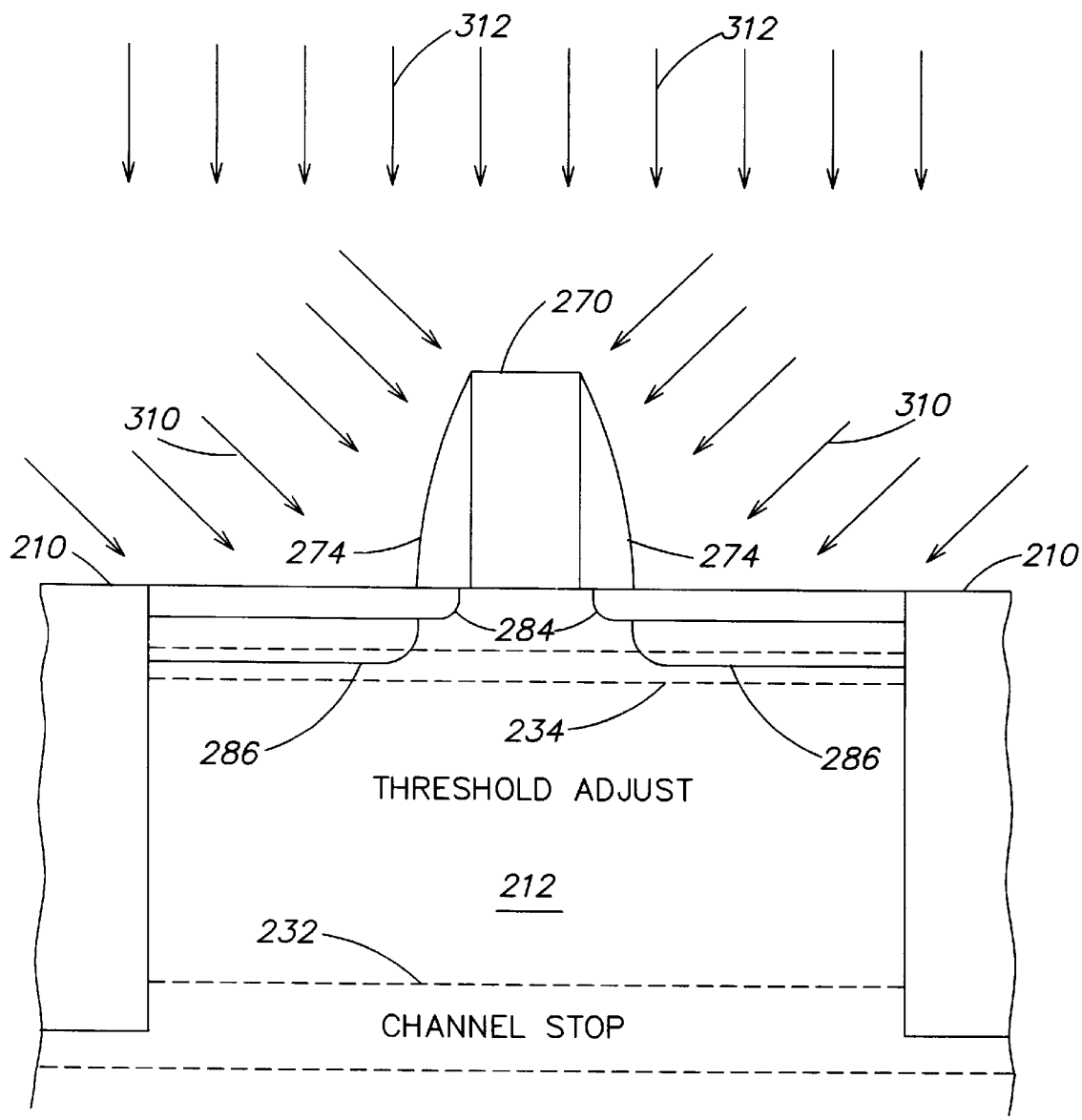
FIG. 4 is an enlarged cross-sectional diagram of an MOS device fabricated in accordance with the process of FIGS. 3A–3H.

A low energy, high tilt angle p+ source/drain extension implant through openings 282 in mask 280 forms source/drain extensions 284 of the p-type devices. The high tilt angle implant is performed at low energy and is performed at an angle in a range of about 15° to near 90° with respect to a normal to the surface of substrate 212. Preferably, the high tilt angle implant is performed at an angle in a range of about 45° to 60° with respect to the normal to the surface of substrate 212. Low energy, high tilt angle implants may be performed with the model VIISta 80 Ion Implanter, manufactured and sold by Varian Semiconductor Equipment Associates, Inc. The high tilt angle implants may be performed at different orientations of substrate 212 with respect to the ion beam. Thus, two or more high tilt orientations, such as +55° and −55°, may be utilized. The high tilt angle implant produces source/drain extensions 284 underneath sidewall spacers 274, as illustrated in FIG. 4 and described below. Source/drain extensions 284 optionally may be formed under portions of gate electrodes 270, depending on the desired spacing between source/drain extensions.

An optional high tilt angle halo or pocket implant through openings 282 in fifth mask 280 may be used to form n-type pocket implants of the p-type devices.

A p+ source/drain implant through openings 282 in fifth mask 280 forms source/drain regions 286 of the p-type devices. The p+ source/drain implant is performed at a low or zero tilt angle with respect to a normal to the surface of substrate 212 and is typically performed at equal to or higher energy and higher dose than the implant of source/drain extensions 284. Thus, source/drain regions 286 are typically deeper than source/drain extensions 284.

Figure 3H:
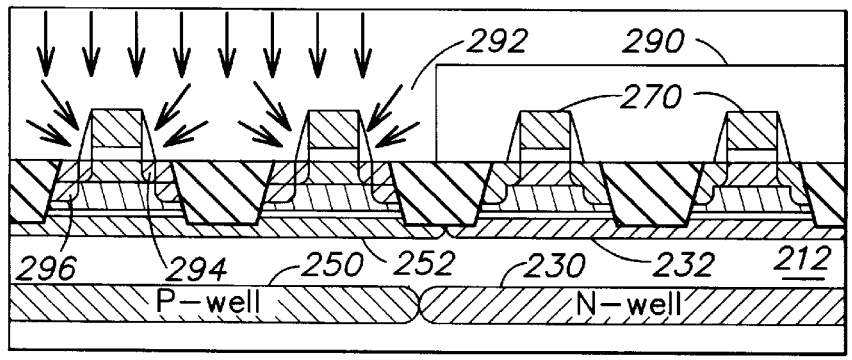

As shown in FIG. 3H, fifth mask 280 is removed from substrate 212, and a sixth mask 290 having openings 292 is disposed on the surface of substrate 212. Sixth mask 290 exposes areas where n-type devices are being fabricated and blocks areas where p-type devices are being fabricated.

A low energy, high tilt angle n+ implant through openings 292 in sixth mask 290 forms source/drain extensions 294 of the n-type devices. As described above in connection with source/drain extensions 284, the implant of source/drain extensions 294 is performed at a high tilt angle with respect to a normal to the surface of substrate 212 and is performed at low energy. Source/drain extensions 294 optionally may be formed under portions of gate electrodes 270, depending on the desired spacing between source/drain extensions.

An optional high tilt angle halo or pocket implant through openings 292 in sixth mask 290 may be used to form p-type pocket implants of the n-type devices.

An n+ source/drain implant through openings 292 in sixth mask 290 forms source/drain regions 296 of the n-type devices. The implant of source/drain regions 296 is performed at low or zero tilt angle with respect to a normal to the surface of substrate 212 and is typically performed at equal to or higher energy and higher dose than the implant of source/drain extensions 294. Thus, source/drain regions 296 are typically deeper than source/drain extensions 294.

Examples of implant parameters suitable for implementing the process of FIGS. 3A–3H are given in Table 1 below. It will be understood that different implant parameters may be utilized within the scope of the invention.

TABLE 1

| Implant | Species | Energy | Dose/in$^2$ | Tilt Angle |
|---|---|---|---|---|
| p-type S/D extensions | Boron BF$_2$ | 100–1000 eV 500–5000 eV | 2E14–2E15 | 45–60° |
| p-type S/D regions | Boron BF$_2$ | 1–5 keV 5–25 keV | 1–5E15 | 0–10° |
| n-type S/D extensions | As Phos | 5–30 keV 2–25 keV | 2E14–2E15 | 45–60° |
| n-typeS/D regions | As Phos | 10–50 keV 5–40 keV | 1-5E15 | 0–10° |
| n-well | Phos | 500 keV–1 MeV | 1–3E13 | 0 to 8° |
| p-type channel stop | Phos As | 200 keV 200–400 keV | 0.5–1E13 | 0 to 8° |
| p-type thres. adj. | Phos, As or Sb | 30–90 keV 20–100 keV | 0.1–1E13 | 0 to 8° |
| p-well | Boron | 200–500 keV | 1–3E13 | 0–8° |
| n-type channel stop | Boron | 40–110 keV | 0.5–1E13 | 0–8° |
| n-type thres. adj. | Boron BF$_2$, In | 5–40 keV 25–60 keV 100–200 keV | 0.1–1E13 | 0–8° |

It may be observed that the process of FIGS. 3A–3H requires four implant masks, whereas the prior art process of FIGS. 2A–2J requires six implant masks. As a result, the process of FIGS. 3A–3H is reduced in complexity and cost as compared with the process of FIGS. 2A–2J.

An enlarged cross-sectional view of an MOS device fabricated in accordance with the process of FIGS. 3A–3H is shown in FIG. 4. It may be observed that the high tilt angle implant, represented by arrows 310, of source/drain extensions 284 ensures that source/drain extensions 284 are formed under sidewall spacers 274 and optionally under portions of gate electrode 270. The fabrication of source/drain extensions 284 does not require a separate mask prior to deposition and etching of sidewall spacers 274 or the use of disposable spacers, as in prior art processes. The low or zero tilt angle implant, represented by arrows 312, of source/drain regions 286 is blocked by gate electrode 270 and sidewall spacers 274 and provides source/drain regions 286 that are deeper than source/drain extensions 284. As a result, source/drain extensions 284 and source/drain regions 286 can be fabricated with a single implant mask as described above.

Figure 5A:
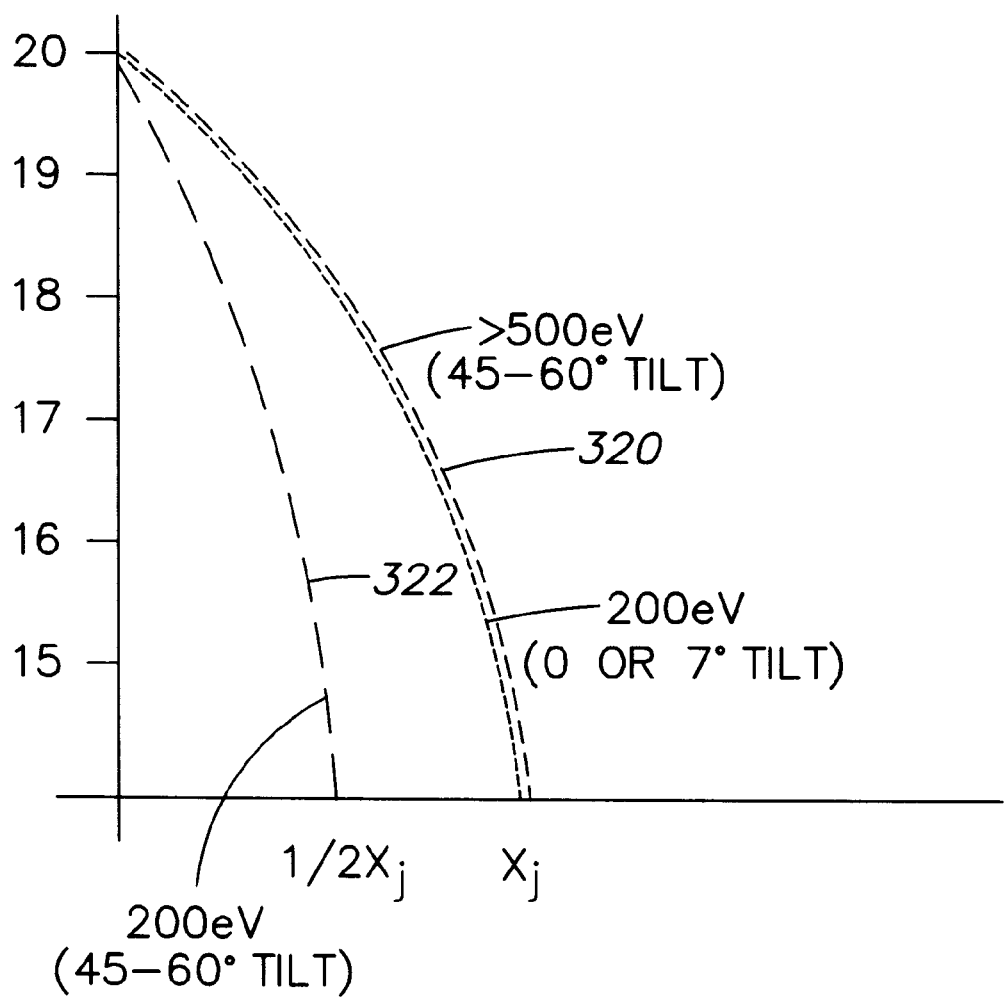
FIG. 5A is graph of dopant concentration as a function of depth below the substrate surface, illustrating the effect of high tilt angle implantation on junction depth.

A graph of impurity concentration as a function of depth from the surface of substrate 212 is shown in FIG. 5A. Curve 320 represents an impurity profile that may be achieved at low or zero tilt angle and a given ion energy, such as 200 electron volts. Curve 322 represents an impurity profile that may be achieved at the same ion energy and a high tilt angle with respect to the normal to the substrate surface. By increasing the tilt angle of the ion beam with respect to the substrate surface, the junction depth $X_j$ may be reduced by approximately cos θ, where θ is the tilt angle. Curve 322 indicates that extremely shallow junction depths, not previously achievable with low or zero tilt angle implants, may be achieved with high tilt angle implants.

Figure 5B:
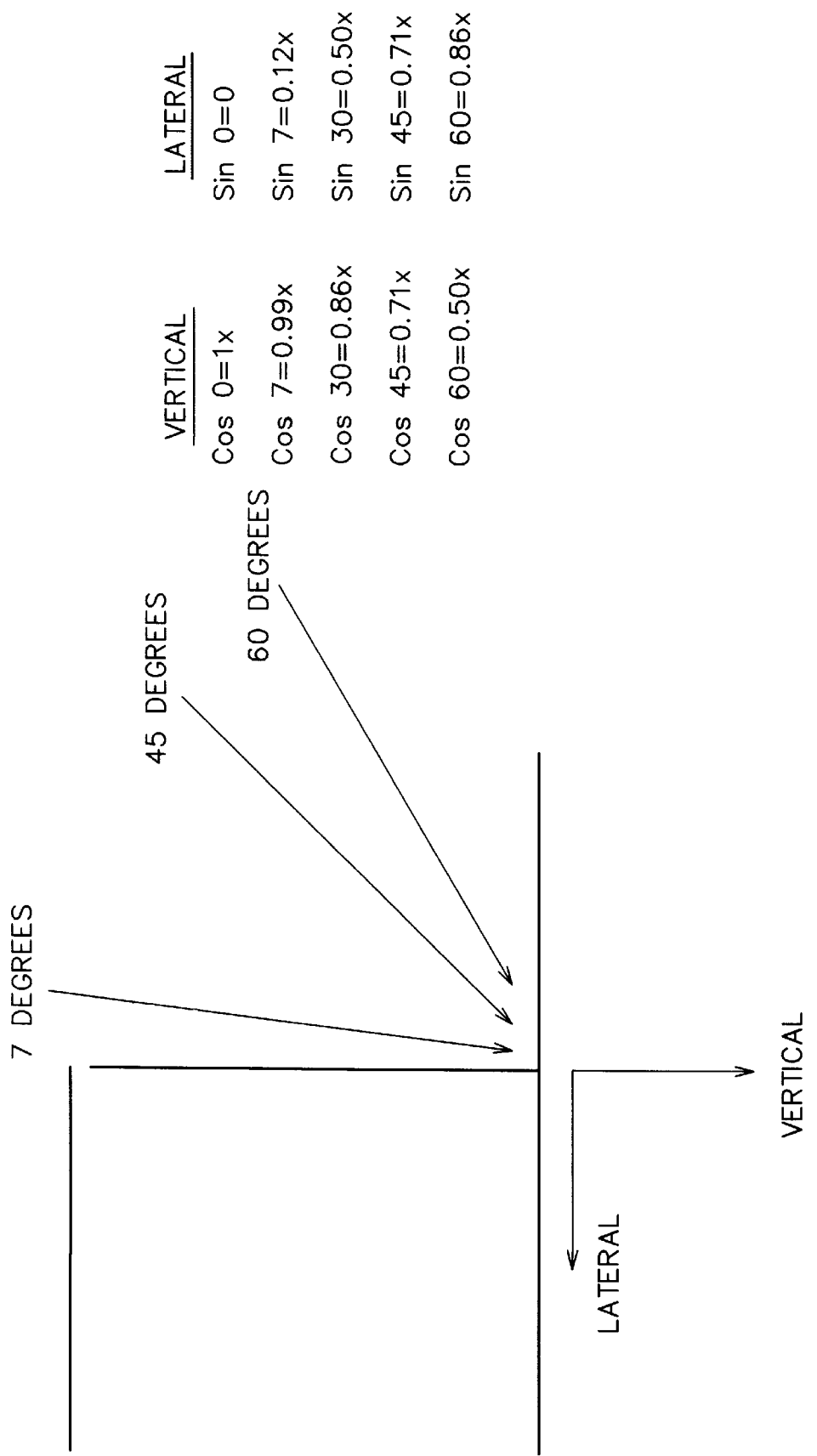
FIG. 5B illustrates the vertical and lateral components of implant depth for various tilt angles of the ion beam with respect to a normal to the substrate surface.

The vertical and lateral components of implant depth for various tilt angles with respect to the normal to the substrate surface are illustrated in FIG. 5B. As indicated, the vertical component is a function of cos θ, and the lateral component is a function of sin θ. It will be understood that the vertical and lateral components of implant depth are also functions of the characteristics of the substrate.

The impurity profile represented by curve 320 may be achieved at a high tilt angle and a higher ion energy, such as 500 electron volts. These parameters are significant because ion implanters typically operate more efficiently at higher energies. By performing ion implantation at a high tilt angle with respect to the substrate surface, the ion beam energy can be increased, thereby increasing beam current, reducing implant time and improving equipment throughput.

Figure 6A:
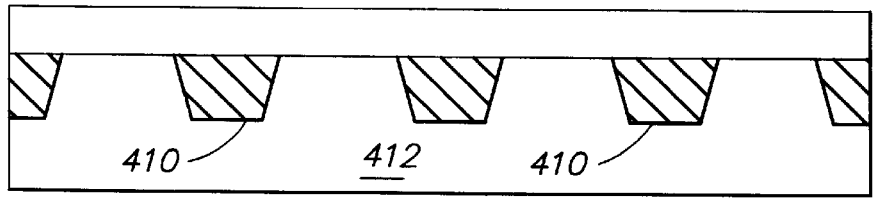
FIGS. 6A–6D illustrate a process for fabrication of CMOS circuitry in accordance with a second embodiment of the invention.

A simplified process for fabricating CMOS integrated circuits in accordance with a second embodiment of the invention is shown in FIGS. 6A–6D. As shown in FIG. 6A, a first mask (not shown) is used to form isolation regions 410 in a substrate 412 by LOCOS or STI as described above in connection with FIG. 2A. Isolation regions 410 are spaced apart to define regions for fabrication of p-type devices and n-type devices in substrate 412.

Figure 6B:
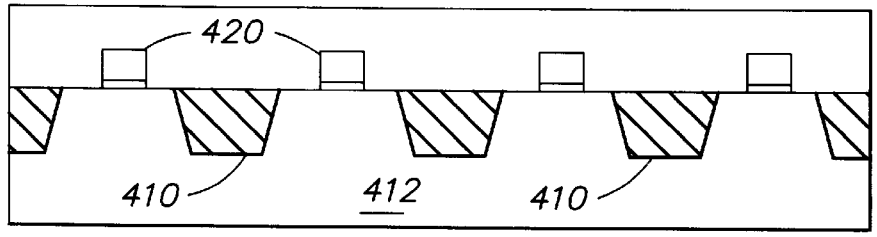

As shown in FIG. 6B, a gate oxide layer and a polysilicon layer are deposited on substrate 412, and a second mask (not shown) is used to etch the gate oxide layer and the polysilicon layer to form gate electrodes 420.

Figure 6C:
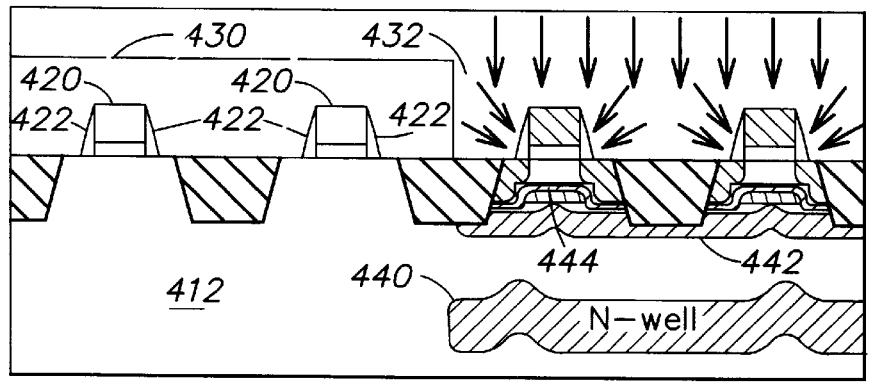

As shown in FIG. 6C, a sidewall insulator layer is deposited on substrate 412 , and the sidewall insulator layer is etched, using a directional etch process, to produce sidewall spacers 422 on the vertical or nearly vertical sides of gate electrodes 420. Then, an optional pre-amorphization implant may be performed as described above.

A third mask 430 having openings 432 is disposed on the surface of substrate 412. Third mask 430 exposes areas where p-type devices are being fabricated and blocks areas where n-type devices are being fabricated. An n-well 440, a channel stop 442 and a $V_{tp}$ threshold adjust 444 of the p-type devices are implanted through openings 432 in third mask 430. An optional punchthrough stop of the p-type devices may be implanted through openings 432 in third mask 430. The implants of n-well 440, channel stop 442, threshold adjust 444 and the optional punchthrough stop of the p-type devices are performed at low or zero tilt angle with respect to a normal to the substrate surface and are performed at sufficient energy to pass through gate electrodes 420. The presence of gate electrodes 420 causes the n-well 440, channel stop 442, threshold adjust 444 and the optional punchthrough stop implant profiles to be contoured, as discussed below.

A low energy, high tilt angle p+ source/drain extension implant through openings 432 in third mask 430 forms source/drain extensions 446 (FIG. 7) of the p-type devices. A p+ source/drain implant through openings 432 in third mask 430 forms source/drain regions 448 (FIG. 7) of the p-type devices. The p+ source/drain implant is performed at low or zero tilt angle with respect to a normal to the surface of substrate 212 and is typically performed at equal to or higher energy and higher dose than the implant of source/drain extensions 446. An optional high tilt angle halo or pocket implant through openings 432 in third mask 430 may be used to form n-type pocket implants of the p-type devices.

Figure 6D:
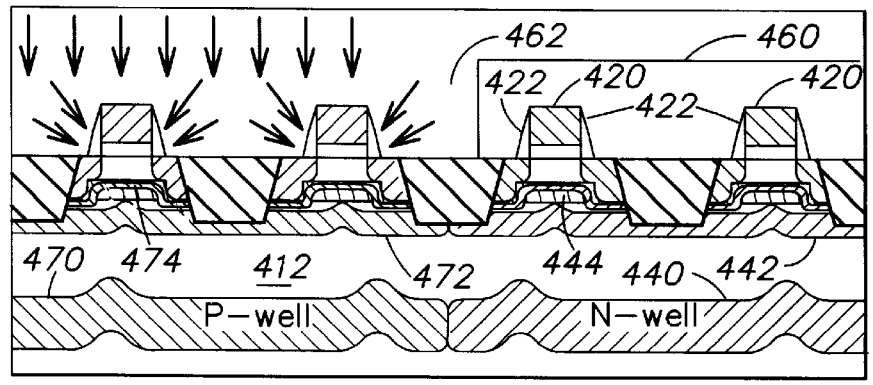

As shown in FIG. 6D, third mask 430 is removed, and a fourth mask 460 having openings 462 is disposed on the surface of substrate 412. Fourth mask 460 exposes areas where n-type devices are being fabricated and blocks areas where p-type devices are being fabricated. A p-well 470, a channel stop 472 and a $V_{tn}$ threshold adjust 474 of the n-type devices are implanted through openings 462 in fourth mask 460. An optional punchthrough stop of the n-type devices may be implanted through openings 462 in fourth mask 460. The implants of p-well 470, channel stop 472, threshold adjust 474 and the optional punchthrough stop of the n-type devices are performed at low or zero tilt angle with respect to a normal to the substrate surface and are performed at sufficient energy to pass through gate electrodes 420. The presence of gate electrodes 420 causes the p-well 470, channel stop 472, threshold adjust 474 and the optional punchthrough stop implant profiles to be contoured, as discussed below.

A low energy, high tilt angle n+ implant through openings 462 in fourth mask 460 forms source/drain extensions 476 (FIG. 7) of the n-type devices. An n+ source/drain implant through openings 462 in fourth mask 460 forms source/drain regions 478 (FIG. 7) of the n-type devices. The implant of source/drain regions 478 is performed at low or zero tilt angle with respect to a normal to the surface of substrate 412 and is typically performed at equal to or higher energy and higher dose than the implant of source/drain extensions 476. Thus, source/drain regions 478 are typically deeper than source/drain extensions 476. An optional high tilt angle halo or pocket implant through openings 462 in fourth mask 460 may be used to form p-type pocket implants of the n-type devices.

It may be observed that the process of FIGS. 6A–6D requires only two implant masks, whereas the prior art process of FIGS. 2A–2J requires six implant masks. As a result, the process of FIGS. 6A–6D is reduced in complexity and cost as compared to the process of FIGS. 2A–2J.

Figure 7:
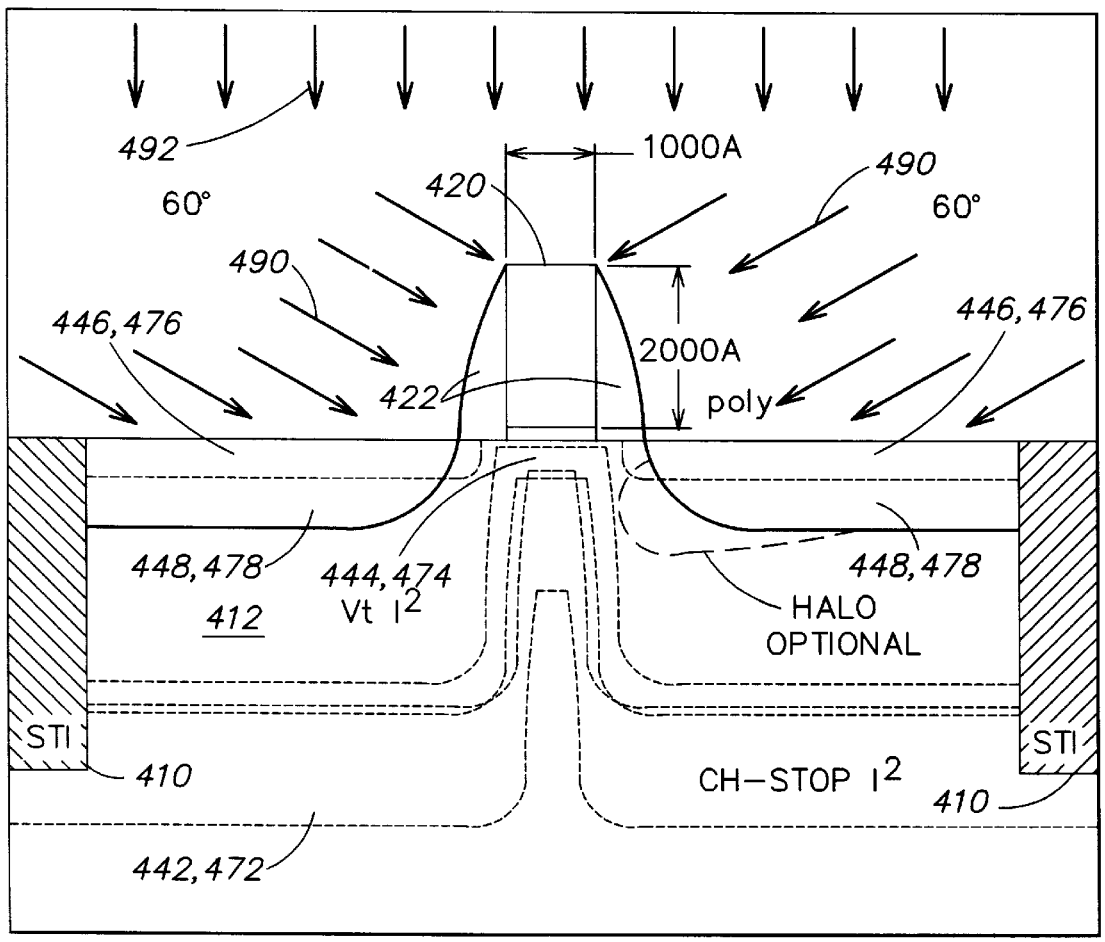
FIG. 7 is an enlarged cross-sectional diagram of an MOS device fabricated with the process of FIGS. 6A–6D.

An enlarged cross-sectional view of an MOS device, either an n-type device or a p-type device, fabricated in accordance with the process of FIGS. 6A–6D is shown in FIG. 7. The low energy, high tilt angle implant, represented by arrows 490, of source/drain extensions 446, 476 ensures that source/drain extensions 446, 476 are formed under sidewall spacers 422 and optionally under portions of gate electrode 420. The fabrication of source/drain extensions 446, 476 does not require a separate mask prior to deposition and etching of sidewall spacers 422 or the use of disposable spacers, as in prior art processes. The low or zero tilt angle implant, represented by arrows 492, of source/drain regions 448, 478 is blocked by gate electrode 420 and sidewall spacers 422 and provides source/drain regions 448, 478 that are deeper than source/drain extensions 446, 476. In addition, the implants of n-well 440 and p-well 470 (not shown in FIG. 7), channel stop 442, 472 and threshold adjust 444, 474 are performed at low or zero tilt angle and at sufficient energy to pass through gate electrode 420 and sidewall spacers 442. The presence of gate electrode 420 and sidewall spacers 442, typically having a vertical dimension of about 2000 angstroms, causes the profiles of n-well 440 and p-well 470, channel stop 442, 472 and threshold adjust 444, 474 to be contoured upwardly toward gate electrode 420, as shown in FIG. 7. However, the upwardly contoured profiles do not detract from the performance of the device and in some cases may improve device performance. In the process of FIGS. 6A–6D, each implant mask is utilized for multiple implants, thereby simplifying the overall process.

Figure 8A:
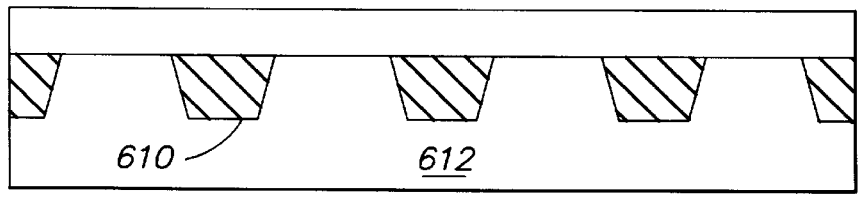
FIGS. 8A–8G illustrate a process for fabrication of CMOS circuitry in accordance with third embodiment of the invention.

A simplified process for fabricating CMOS integrated circuits in accordance with a third embodiment of the invention is shown in FIGS. 8A–8G. As shown in FIG. 8A, a first mask (not shown) is used to form isolation regions 610 in a substrate 612 by LOCOS or STI as described above in connection with FIG. 2A. Isolation regions 610 are spaced apart to define regions for fabrication of p-type devices and n-type devices in substrate 612.

Figure 8B:
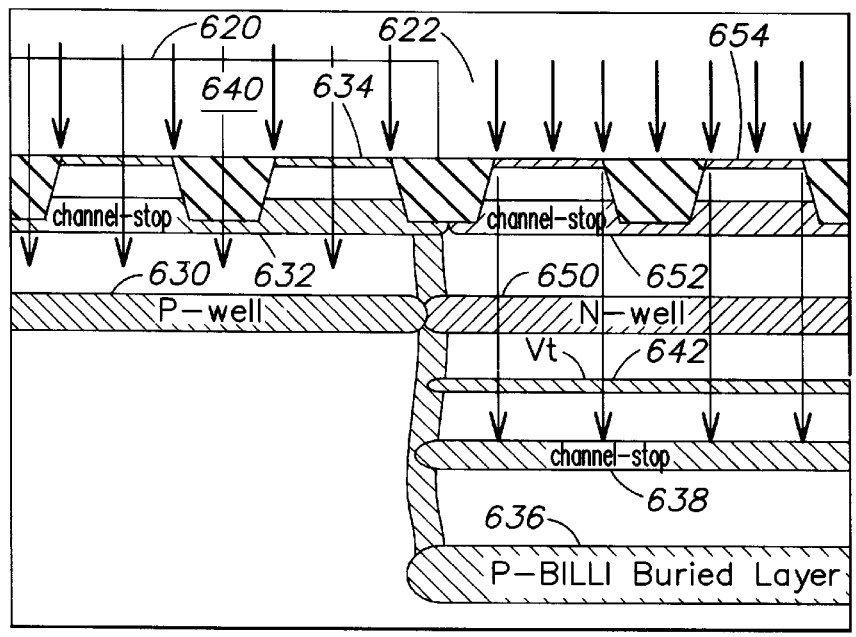

As shown in FIG. 8B, a second mask 620 having openings 622 is disposed on the surface of substrate 612. Second mask 620 exposes areas where p-type devices are being fabricated and blocks areas where n-type devices are being fabricated. Second mask 620 is used to perform a buried implanted layer for lateral isolation (BILLI) process, as described in detail in the aforementioned Pat. Nos. 5,501,993; 5,814,866; and 5,821,589. A p-well 630, a channel stop 632 and a $V_{tn}$ threshold adjust 634 of the n-type devices are implanted through non-open areas 640 of second mask 620 using, for example, boron at energies in the 1 MeV to 2 MeV range. In particular, the implants of p-well 630, channel stop 632 and threshold adjust 634 are performed at low or zero tilt angle with respect to a normal to the substrate surface and are performed at sufficient energy to pass through non-open areas 640 of second mask 620, which normally perform a blocking function. In openings 622 of second mask 620, the implants are deeper and form buried layer 636, channel stop 638 and threshold adjust 640. These implants are sufficiently deep (2–4 micrometers) that they do not interfere with operation of the circuit.

An n-well 650, a channel stop 652 and a $V_{tp}$ threshold adjust 654 of the p-type devices are implanted through openings 622 in second mask 620. The implants of n-well 650, channel stop 652 and threshold adjust 654 of the p-type devices are performed at low or zero tilt angle with respect to a normal to the substrate surface and are performed at energies selected to produce the desired implant depths in openings 622. The implants of n-well 650, channel stop 652 and threshold adjust 654 are blocked by non-open areas 640 of second mask 620. An optional punchthrough stop of the n-type devices may be implanted at sufficiently high energy to pass through non-open areas 640 of second mask 620. An optional punchthrough stop of the p-type devices may be implanted through openings 622 in second mask 620.

Figure 8C:
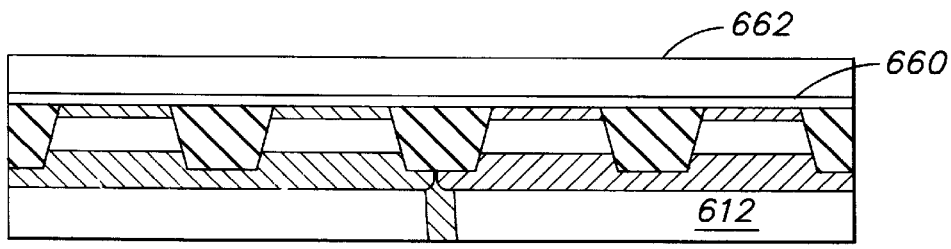
Figure 8D:
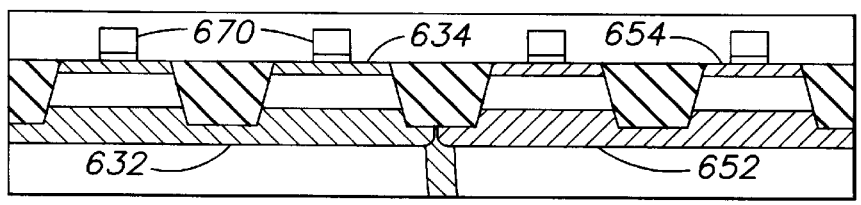

As shown in FIG. 8C, the second mask 620 is removed, and a gate oxide layer 660 and a polysilicon layer 662 are deposited on substrate 612. As shown in FIG. 8D, a third mask (not shown) is used to etch the gate oxide layer and the polysilicon layer to form gate electrodes 670.

Figure 8E:
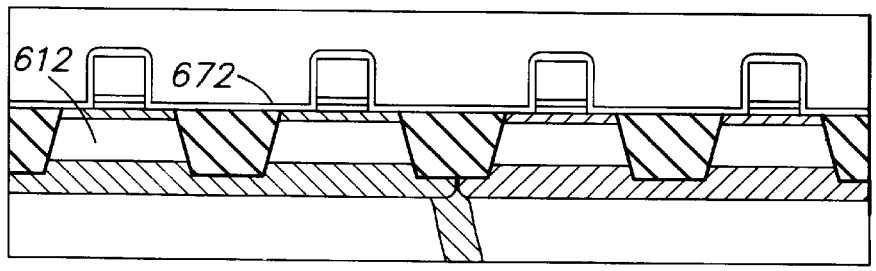

As shown in FIG. 8E, a sidewall insulator layer 672 is deposited on substrate 612, and the sidewall insulator layer 672 is etched, using a directional etch process, to produce sidewall spacers 674 (see FIG. 8F) on the vertical or nearly vertical sides of gate electrodes 670. Then, an optional pre-amorphization implant may be performed as described above.

Figure 8F:
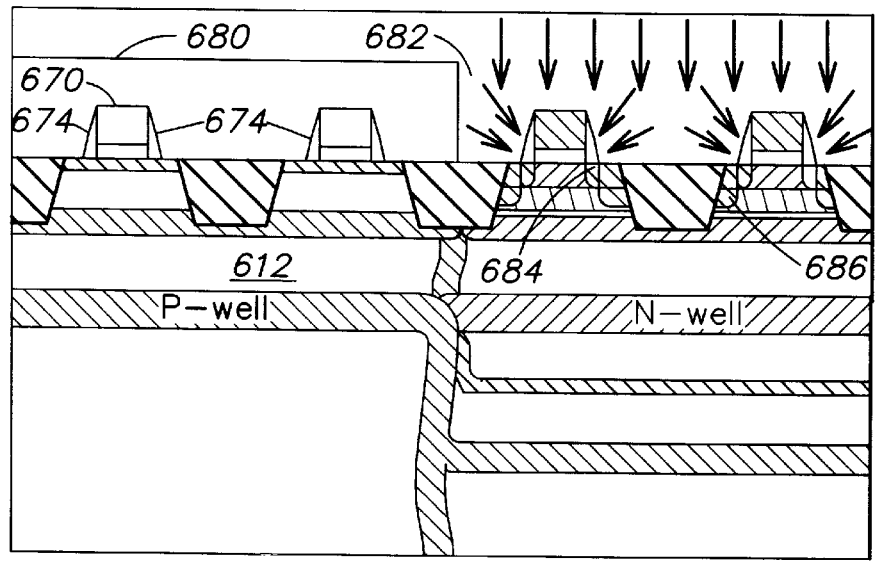

As shown in FIG. 8F, a fourth mask 680 having openings 682 is disposed on the surface of substrate 612. Fourth mask 680 exposes areas where p-type devices are being fabricated and blocks areas where n-type devices are being fabricated. A low energy, high tilt angle p+ source/drain extension implant through openings 682 in fourth mask 680 forms source/drain extensions 684 of the p-type devices. A p+ source/drain implant through openings 682 in fourth mask 680 forms source/drain regions 686 of the p-type devices. The p+ source/drain implant is performed at low or zero tilt angle with respect to a normal to the surface of substrate 612 and is typically performed at equal to or higher energy and higher dose than the implant of source/drain extensions 684. An optional high tilt angle halo or pocket implant through openings 682 in fourth mask 680 may be used to form n-type pocket implants of the p-type devices.

Figure 8G:
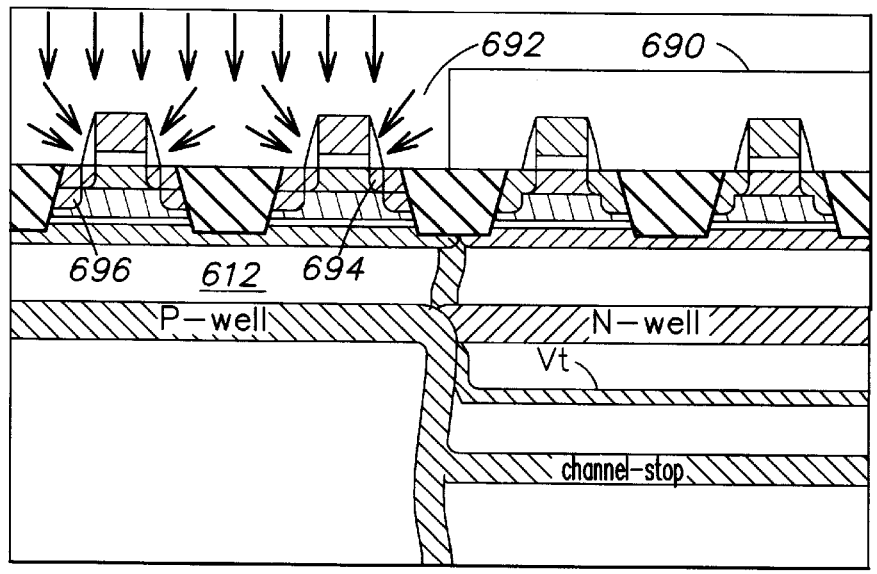

As shown in FIG. 8G, fourth mask 680 is removed, and a fifth mask 690 having openings 692 is disposed on the surface of substrate 612. Fifth mask 690 exposes areas where n-type devices are being fabricated and blocks areas where p-type devices are being fabricated. A low energy, high tilt angle n+ implant through openings 692 in fifth mask 690 forms source/drain extensions 694 of the n-type devices. An n+ source/drain implant through openings 692 in fifth mask 690 forms source/drain regions 696 of the n-type devices. The implant of source/drain region 696 is performed at low or zero tilt angle with respect to a normal to the surface of substrate 612 and is typically performed at equal to or higher energy and higher dose than the implant of source/drain extensions 694. Thus, source/drain regions 696 are typically deeper than source/drain extensions 694. An optional high tilt angle halo or pocket implant through openings 692 in fifth mask 690 may be used to form p-type pocket implants of the n-type devices.

It may observed that the process of FIGS. 8A–8G requires only three implant masks, whereas the process of FIGS. 2A–2J requires six implant masks. As a result, the process of FIGS. 8A–8G is reduced in complexity and cost as compared to the process of FIGS. 2A–2J.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A method for use in the fabrication of a circuit on a substrate, comprising the steps of:

after formation of gate electrodes, depositing a sidewall insulator layer and etching the sidewall insulator layer to form sidewall spacers on the sides of the gate electrodes;

implanting source/drain extensions of p-type devices through openings in a first mask;

implanting source/drain regions of the p-type devices through the openings in said first mask;

implanting source/drain extensions of n-type devices through openings in a second mask;

implanting source/drain regions of the n-type devices through the openings in said second mask, the steps of implanting source/drain extensions being performed at low energy and at a high tilt angle with respect to a normal to the substrate surface, wherein said source/drain extensions are formed laterally under said sidewall spacers, and the steps of implanting source/drain regions being performed at low or zero tilt angle with respect to the normal to the substrate surface and at equal to or higher energy and higher dose than the steps of implanting source/drain extensions; and implanting an n-well for the p-type devices through the openings in said first mask, implanting a channel stop for the p-type devices through the openings in said first mask, and implanting a $V_{tp}$ threshold adjust for the p-type devices through the openings in said first mask, the steps of implanting said n-well, said channel stop and said $V_{tp}$ threshold adjust for the p-type devices being performed at sufficient energy to pass through said gate electrodes and at low or zero tilt angle with respect to the normal to the substrate surface.

2. A method as defined in claim 1 further comprising the step of performing a halo implant of the p-type devices through the openings in said first mask.

3. A method as defined in claim 1 further comprising the step of performing a halo implant of the n-type devices through the openings in said second mask.

4. A method as defined in claim 1 wherein the steps of implanting source/drain extensions are performed at tilt angles in a range of about 45 to 60 degrees.

5. A method as defined in claim 1 further comprising the step of implanting a pre-amorphization layer prior to the steps of implanting source/drain extensions and implanting source/drain regions.

6. A method as defined in claim 5 further comprising the step of thermally treating the substrate at 500° C. to 800° C. in a low temperature solid phase epitaxial regrowth process.

7. A method as defined in claim 1 wherein the steps of implanting source/drain extensions are performed at tilt angles and energies selected such that the source/drain extensions are formed laterally under portions of said gate electrodes.

8. A method as defined in claim 1 further comprising the step of implanting a punchthrough stop for the p-type devices through the openings in said first mask.

9. A method as defined in claim 1 further comprising the steps of implanting a p-well for the n-type devices through the openings in said second mask, implanting a channel stop for the n-type devices through the openings in said second mask, and implanting a $V_{tn}$ threshold adjust for the n-type devices through the openings in said second mask, the steps of implanting said p-well, said channel stop and said $V_{tn}$ threshold adjust for the n-type devices being performed at sufficient energy to pass through said gate electrodes and at low or zero tilt angle with respect to the normal to the substrate surface.

10. A method as defined in claim 9 further comprising the step of implanting a punchthrough stop for the n-type devices through the openings in said second mask.

11. A method for use in the fabrication of a device on a substrate, comprising the steps of:

after formation of a gate electrode of the device, depositing a sidewall insulator layer and etching the sidewall insulator layer to form sidewall spacers on the sides of the gate electrode;

implanting source/drain extensions of the device through openings in a mask, the step of implanting source/drain extensions being performed at low energy and at a high tilt angle with respect to a normal to the substrate surface, wherein said source/drain extensions are formed laterally under said sidewall spacers;

implanting source/drain regions of the device through the openings in said mask, the step of implanting source/ drain regions being performed at low or zero tilt angle with respect to the normal to the substrate surface and at equal to or higher energy and higher dose than the step of implanting source/drain extensions; and implanting a well for the device through the openings in said mask, implanting a channel stop for the device through the openings in said mask and implanting a $V_t$ threshold adjust for the device through the openings in said mask, the steps of implanting said well, said channel stop and said $V_t$ threshold adjust being performed at sufficient energy to pass through said gate electrode and at low or zero tilt angle with respect to the normal to the substrate surface.

12. A method as defined in claim 11 wherein the step of implanting source/drain extensions is performed at a tilt angle in a range of about 45 to 60 degrees.

13. A method as defined in claim 11 further comprising the step of implanting a pre-amorphization layer prior to the steps of implanting source/drain extensions and implanting source/drain regions.

14. A method as defined in claim 13 further comprising the step of thermally treating the substrate at 500° C. to 800° C. in a low temperature solid phase epitaxial regrowth process.

15. A method as defined in claim 11 wherein the steps of implanting source/drain extensions are performed at tilt angles and energies selected such that the source/drain extensions are formed laterally under portions of said gate electrodes.

16. A method for use in the fabrication of a circuit on a substrate, comprising the steps of:

after formation of gate electrodes, depositing a sidewall insulator layer and etching the sidewall insulator layer to form sidewall spacers on the sides of the gate electrodes;

implanting source/drain extensions of p-type devices through openings in a first mask;

implanting source/drain regions of the p-type devices through the openings in said first mask;

implanting source/drain extensions of n-type devices through openings in a second mask;

implanting source/drain regions of the n-type devices through the openings in said second mask, the steps of implanting source/drain extensions being performed at low energy and at a high tilt angle with respect to a normal to the substrate surface, wherein said source/drain extensions are formed laterally under said sidewall spacers, and the steps of implanting source/drain regions being performed at low or zero tilt angle with respect to the normal to the substrate surface and at equal to or higher energy and higher dose than the steps of implanting source/drain extensions; and implanting a p-well for the n-type devices through the openings in said second mask, implanting a channel stop for the n-type devices through the openings in said second mask, and implanting a $V_{tn}$ threshold adjust for the n-type devices through the openings in said second mask, the steps of implanting said p-well, said channel stop and said $V_{tn}$ threshold adjust for the n-type devices being performed at sufficient energy to pass through said gate electrodes and at low or zero tilt angle with respect to the normal to the substrate surface.

* * * * *